(12) United States Patent
Lazar et al.

(10) Patent No.: US 9,013,635 B2
(45) Date of Patent: *Apr. 21, 2015

(54) MULTI-INPUT MULTI-OUTPUT TIME ENCODING AND DECODING MACHINES

(75) Inventors: Aurel A. Lazar, New York, NY (US); Eftychios A. Pnevmatikakis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 516 days.

This patent is subject to a terminal disclaimer.

(21) Appl. No.: 13/214,041

(22) Filed: Aug. 19, 2011

(65) Prior Publication Data

US 2012/0039399 A1 Feb. 16, 2012

Related U.S. Application Data

(63) Continuation of application No. 12/645,292, filed on Dec. 22, 2009, now Pat. No. 8,023,046, which is a continuation of application No. PCT/US2008/068790, filed on Jun. 30, 2008.

(60) Provisional application No. 60/946,918, filed on Jun. 28, 2007, provisional application No. 61/037,224, filed on Mar. 17, 2008.

(51) Int. Cl.
| | |
|---|---|
| *H04L 27/00* | (2006.01) |
| *H03M 3/00* | (2006.01) |
| *H03M 1/12* | (2006.01) |
| *H03M 1/66* | (2006.01) |
| *H03M 1/82* | (2006.01) |
| *H03M 1/50* | (2006.01) |

(52) U.S. Cl.
CPC ............ *H03M 3/466* (2013.01); *H03M 1/1205* (2013.01); *H03M 1/125* (2013.01); *H03M 1/50* (2013.01); *H03M 1/662* (2013.01); *H03M 1/82* (2013.01); *H03M 3/43* (2013.01); *H03M 3/504* (2013.01)

(58) Field of Classification Search
CPC ......... H03M 1/50; H03M 1/82; H03M 1/125; H03M 1/662; H03M 1/1205; H03M 3/43; H03M 3/466; H03M 3/504
USPC ............ 341/110–172; 348/723; 375/295, 340
See application file for complete search history.

(56) References Cited

U.S. PATENT DOCUMENTS

| | | |
|---|---|---|
| 5,079,551 A | 1/1992 | Kimura et al. |
| 5,200,750 A | 4/1993 | Fushiki et al. |
| 5,392,042 A | 2/1995 | Pellon |

(Continued)

FOREIGN PATENT DOCUMENTS

| | | |
|---|---|---|
| WO | WO 2006/102178 | 9/2006 |
| WO | WO 2008/151137 | 12/2008 |

OTHER PUBLICATIONS

U.S. Appl. No. 12/628,067, Mar. 6, 2012 Resopnse to Non-Final Office Action.

(Continued)

*Primary Examiner* — Lam T Mai
(74) *Attorney, Agent, or Firm* — Baker Botts, L.L.P.

(57) ABSTRACT

Methods and systems for encoding and decoding signals using a Multi-input Multi-output Time Encoding Machine (TEM) and Time Decoding Machine are disclosed herein.

20 Claims, 8 Drawing Sheets

(56) References Cited

U.S. PATENT DOCUMENTS

| | | | |
|---|---|---|---|
| 5,392,044 A * | 2/1995 | Kotzin et al. | 341/155 |
| 5,393,237 A * | 2/1995 | Roy et al. | 439/134 |
| 5,396,244 A | 3/1995 | Engel | |
| 5,424,735 A * | 6/1995 | Arkas et al. | 341/157 |
| 5,511,003 A | 4/1996 | Agarwal | |
| 5,561,425 A | 10/1996 | Therssen | |
| 5,568,142 A * | 10/1996 | Velazquez et al. | 341/126 |
| 5,761,088 A | 6/1998 | Hulyalkar et al. | |
| 5,815,102 A | 9/1998 | Melanson | |
| 6,081,299 A | 6/2000 | Kesselring et al. | |
| 6,087,968 A | 7/2000 | Roza | |
| 6,121,910 A * | 9/2000 | Khoury et al. | 341/143 |
| 6,177,893 B1 | 1/2001 | Velazquez et al. | |
| 6,177,910 B1 * | 1/2001 | Sathoff et al. | 343/766 |
| 6,332,043 B1 * | 12/2001 | Ogata | 382/240 |
| 6,369,730 B1 | 4/2002 | Blanken et al. | |
| 6,441,764 B1 * | 8/2002 | Barron et al. | 341/155 |
| 6,476,749 B1 * | 11/2002 | Yeap et al. | 341/155 |
| 6,476,754 B2 * | 11/2002 | Lowenborg et al. | 341/155 |
| 6,511,424 B1 * | 1/2003 | Moore-Ede et al. | 600/300 |
| 6,515,603 B1 | 2/2003 | McGrath | |
| 6,646,581 B1 | 11/2003 | Huang | |
| 6,744,825 B1 | 6/2004 | Rimstad et al. | |
| 6,961,378 B1 | 11/2005 | Greenfield et al. | |
| 7,028,271 B2 * | 4/2006 | Matsugu et al. | 716/107 |
| 7,336,210 B2 * | 2/2008 | Lazar | 341/110 |
| 7,346,216 B2 | 3/2008 | Adachi et al. | |
| 7,479,907 B2 * | 1/2009 | Lazar | 341/110 |
| 7,750,835 B1 | 7/2010 | Albrecht et al. | |
| 7,764,716 B2 | 7/2010 | McKnight et al. | |
| 7,948,869 B2 | 5/2011 | Peter et al. | |
| 7,966,268 B2 | 6/2011 | Anderson et al. | |
| 8,023,046 B2 * | 9/2011 | Lazar et al. | 348/723 |
| 8,199,041 B2 | 6/2012 | Nakajima | |
| 8,223,052 B1 | 7/2012 | Kong et al. | |
| 8,314,725 B2 | 11/2012 | Zepeda et al. | |
| 8,595,157 B2 | 11/2013 | Albrecht et al. | |
| 2001/0044919 A1 | 11/2001 | Edmonston et al. | |
| 2004/0071354 A1 | 4/2004 | Adachi et al. | |
| 2004/0158472 A1 | 8/2004 | Voessing | |
| 2005/0190865 A1 | 9/2005 | Lazar et al. | |
| 2005/0252361 A1 | 11/2005 | Oshikiri | |
| 2006/0261986 A1 | 11/2006 | Lazar | |
| 2009/0141815 A1 | 6/2009 | Peter et al. | |
| 2009/0190544 A1 | 7/2009 | Meylan et al. | |
| 2010/0138218 A1 | 6/2010 | Geiger | |
| 2010/0303101 A1 | 12/2010 | Lazar et al. | |
| 2012/0084040 A1 | 4/2012 | Lazar et al. | |
| 2012/0310871 A1 | 12/2012 | Albrecht et al. | |
| 2012/0317061 A1 | 12/2012 | Lakshminarayan et al. | |
| 2013/0311412 A1 | 11/2013 | Lazar et al. | |

OTHER PUBLICATIONS

U.S. Appl. No. 12/645,292, Aug. 17, 2011 Issue Fee payment.
U.S. Appl. No. 12/645,292, May 17, 2011 Notice of Allowance.
U.S. Appl. No. 12/645,292, Apr. 27, 2011 Response to Non-Final Office Action.
U.S. Appl. No. 12/645,292, Jan. 7, 2011 Non-Final Office Action.
U.S. Appl. No. 12/628,067, Nov. 23, 2011 Non-Final Office Action.
Lazar et al., "Perfect recovery and sensitivity analysis of time encoded bandlimited signals", *IEEE Transactions on Circuits and Systems*, 51(10): 2060-2073, Oct. 2004.
Lazar et al., "Real-Time Algorithm for Time Decoding Machines", *EUSIPCO '06* (Sep. 2006).
Lazar, A.A., "Time Encoding Machines with Multiplicative Coupling, Feedforward, and Feedback", Circuits and Systems II: Express Briefs, IEEE Transactions on vol. 53, Issue 8, Aug. 2006, pp. 672-676.
Lazar, A.A., "Time Encoding and Perfect Recovery of Bandlimited Signals", Acoustics, Speech, and Signal Processing, 2003, Proceedings (ICASSP 2003), 2003 IEEE International Conference on vol. 6, pp. VI-709-712 vol. 6.
Lazar, Aurel A., "Time Encoding Using Filter Banks and Integrate and-Fire Neurons", Department of Electrical Engineering, Columbia University, Sep. 2003.
U.S. Appl. No. 12/628,067, Aug. 1, 2013 Amendment and Request for Continued Examination (RCE).
U.S. Appl. No. 12/628,067, Jul. 19, 2012 Non-Final Office Action.
U.S. Appl. No. 12/628,067, Mar. 1, 2013 Final Office Action.
U.S. Appl. No. 12/628,067, Jan. 16, 2013 Response to Non-Final Office Action.
U.S. Appl. No. 13/948,615, Dec. 18, 2013 Non-Final Office Action.
Akay, "Time Frequency and Wavelets in Biomedical signal Processing", Wiley-IEEE Press, Table of Contents (1997) Retrieved at http://www.wiley.com/WileyCDA/WileyTitle/productCd-0780311477,miniSiteCd-IEEE2 on Aug. 6, 2008.
Aksenov, et al., "Biomedical Data Acquisition Systems Based on Sigma-Delta Analogue-To Digital converters", *2001 Proceedings of the 23rd Annual EMBS International Conference*, Istanbul, Turkey, 4:3336-3337 (Oct. 25-28, 2001).
Antoine, et al., "Two-Dimensional Wavelets and Their Relatives", Cambridge University Press, Table of Contents (2004).
Averbeck, et al., "Neural Correlations, Population Coding and Computation", *Nature*, 7:358-366 (2006).
Balan, et al., "Multiframes and Multi Riesz Bases: I. The General theory and Weyl-Heisenberg Case", *Technical Report, Institute for mathematics and its Applications*, (18 pages) (1997).
Balan, "Multiplexing of Signals using Superframes", *Wavelets Applications in Signal and Image Processing VIII*, 4119:118-130 (2000).
Barr, et al., "Energy Aware Lossless Data Compression", *Proceedings of the 1st International Conference on Mobile Systems, Applications and Services*, San Francisco, CA, pp. 231-244 (2003).
Bjorck, et al., "Solution of Vandermonde Systems of Equations", *Mathematics of Computation*, 24(112):893-903 (1970).
Butts, et al., "Temporal Precision in the Neural code and the Timescales of Natural Vision", *Nature*, 449(7158):92-95 (2007).
Christensen, "Frames, Riesz Bases, and Discrete Gabor/Wavelet Expansions", *American Mathematical Society*, 38(3):273-291 (2001).
Christensen, "An Introduction to Frames and Riesz Bases", *Springer*, Table of Contents (2003) http://www.springer.com/birkhauser/mathematics/books/978-0-8176-4295-2?detailsPage=toc Retrieved on Aug. 6, 2008.
Dayan et al., "Theoretical Neuroscience", The MIT Press, Table of Contents (2001) http://mitpress.mit.edu/catalog/item/default.asp?ttyoe=2&tid=8590&mode=toc Retrieved on line Aug. 6, 2008.
Delbruck, "Frame-Free Dynamic Digital Vision", *Proceedings of international Symposium on Secure-Life Electronics, Advanced Electronics for Quality Life and Society*, University of Tokyo, pp. 21-26 (Mar. 6-7, 2008).
Deneve, et al., "Reading Population Codes: A Neural Implementation of Ideal Observers", *Nature Neuroscience*, 2(8):740-745 (1999).
Dods, et al., "Asynchronous Sampling for Optical Performance Monitoring", *Optical fiber Communication Conference*, Anaheim, California (3 pages) (2007).
Eldar, et al., "Sampling with Arbitrary Sampling and Reconstruction Spaces and Oblique dual Frame Vectors", *The Journal of Fourier Analysis and Applications*, 9(1):77-96 (2003).
Eldar, et al., "General Framework for Consistent Sampling in Hilbert Spaces", *International journal of Wavelets, Multiresolution and information Processing*, 3(3):347-359 (2005).
Fain, "Sensory Transduction", *Sinauer Associates, Inc.*, Table of contents (2003) Retrieved http://www.sinauer.com/detail.php?id=1716 on Aug. 6, 2008.
Feichter, et al., "Theory and Practice of Irregular Sampling", Wavelets: Mathematics and Applications, CRC Press, *Studies in Advanced Mathematics*, pp. 305-363 (1994).
Feichter, et al., "Efficient Numerical Methods in Non-Uniform Sampling Theory", *Numer. Math.*, 69:423-440 (1995).
Feichter, et al., "Improved Locality for Irregular Sampling Algorithms", *2000 International Conference on Acoustic, Speech, and Signal Processing*, Istanbul, Turkey, Table of Contents (Jun. 5-9, 2000).
Field, et al., "Information Processing in the Primate Retina: Circuitry and Coding", *Annual Reviews Neuroscience*, 30(1):1-30 (2007).

(56) References Cited

OTHER PUBLICATIONS

Häfliger, et al., "A Rank Encoder: Adaptive Analog to Digital conversion Exploiting Time Domain Spike Signal Processing", *Analog Integrated Circuits and Signal Processing Archive*, 40(1):39-51 (2004).

Han, et al., "Memoirs of the American Mathematical Society: Frames, Baese and Group Presentations", American Mathematical Society, 147(697): Table of Contents (2000).

Harris, et al., "Real Time Signal Reconstruction from Spikes on a Digital Signal Processor", *IEEE International Symposium on Circuits and Systems (ISCAS 2008)*, pp. 1060-1063 (2008).

Haykin, et al., "Nonlinear Adaptive Prediction of Nonstationary Signals", *IEEE Transactions on Signal Processing*, 43(2):526-535 (1995).

Hudspeth, et al., "Auditory Neuroscience: Development, Transduction, and Integration", *PNAS*, 97(22):11690-11691 (2000).

Jaffard, "A Density Criterion for Frames of Complex Exponentials", *Michigan Math J.*, 38:339-348 (1991).

Jones, et al., "An Evaluation of the Two-Dimensional Gabor Filter Model of Simple Receptive Fields on Cat Striate Cortex", *Journal of Neurophysiology*, 58(6):1233-1258 (1987).

Jovanov, et al., "A Wireless Body Area network of Intelligent motion sensors for computer Assisted Physical Rehabilitation", *Journal of NeuroEngineering and Rehabilitation*, 2:6 (10 pages) (2005).

Kaldy, et al., "Time Encoded Communications for Human Area Network Biomonitoring", *BNET Technical Report #2-7*, Department of Electrical Engineering, Columbia University, (8 pages) (2007).

Keat, et al., "Predicting Every Spike: A Model for the Responses of Visual Neurons", *Neuron*, 30:803-817 (2001).

Kim, et al., "A Comparison of Optimal MIMO Linear and Nonlinear Models for Brain-Machine Interfaces", *Journal of Neural Engineering*, 3:145-161 (2006).

Kinget, et al., "On the Robustness of an Analog VLSI Implementation of a Time Encoding Machine", *IEEE International Symposium on Circuits and Systems*, pp. 4221-4224 (2005).

Kong, et al., "A Time-Encoding Machine Based High-Speed Analog-to-Digital Converter", *IEEE Journal on Emerging and Selected Topics in Circuits and Systems*, 2(3):552-563 (2012).

Kovacevic, et al., "Filter Bank Frame Expansions with Erasures", *IEEE Transactions on Information Theory*, 48(6):1439-1450 (2002).

Krishnapura, et al., "A Baseband Pulse Shaping Filter for Gaussian Minimum Shift Keying", *ISCAS '98, IEEE International Symposium on circuits and Systems*, vol. 1:249-252 (1998).

Lazar, et al., "Encoding, Processing and Decoding of Sensory Stimuli with a Spiking Neural Population", *Research in encoding and Decoding of Neural Ensembles*, Santiori, Greece, (1 page) (Jun. 26-29, 2008).

Lazar, "A Simple Spiking Retina Model for Exact Video Stimulus Representation", The Computational Neuroscience Meeting, CNS 2008, Portland, Oregon (1 page) (Jul. 19-24, 2008).

Lazar, et al., "Time Encoding and Time Domain Computing of Video Streams", Department of Electrical engineering Columbia University, (20 pages) (Mar. 14, 2008).

Lazar, et al., "A MIMO Time Encoding Machine", submitted for publication Jan. 2008, (28 pages).

Lazar, et al., "Encoding of Multivariate Stimuli with MIMO Neural Circuits", *Proceedings of the IEEE International Symposium on Information Theory*, Saint Petersburg, Russia, (5 pages) (Jul. 31-Aug. 5, 2011).

Lazar, et al., "Video Time Encoding Machines", submitted for publication Oct. 2008, (27 pages).

Lazar, et al., "Channel Identification Machines", *Computational Intelligence and Neuroscience*, 2012:209590 (20 pages) (2012).

Lazar, "Multichannel Time Encoding with Integrate-and-Fire Neurons", *Neurocomputing*, 65-66:401-407 (2005).

Lazar, "Recovery of Stimuli Encoded with Hodgkin-Huxley Neurons", *Computational and Systems Neuroscience Meeting, COSYNE 2007*, Salt Lake City, UT, Feb. 22-25, 2007, *Cosyne Poster 111-94*, p. 296.

Lazar, "Time Encoding with an Integrate-and-Fire Neuron with a Refractory Period", *Neurocomputing*, 58-60:53-58 (2004).

Lazar, et al., "Video Time Encoding Machines", *IEEE Transactions on Neural Networks*, 22(3):461-473 (2011).

Lazar, "Population Encoding with Hodgkin-Huxley Neurons", *IEEE Transactions on Information Theory*, 56(2):821-837 (2010).

Lazar, "Information Representation with an Ensemble of Hodgkin-Huxley Neurons", *Neurocomputing*, 70:1764-1771 (2007).

Lazar, et al., "Encoding Natural Scenes with Neural circuits with Random Thresholds", *Vision Research, Special Issue on Mathematical Models of Visual Coding*, 50(22):2200-2212 (2010).

Lazar, "A Simple Model of Spike Processing", *Neurocomputing*, 69:1081-1085 (2006).

Lazar, et al., "Faithful Representation of Stimuli with a Population of Integrate-and-Fire Neurons", *Neural Computers*, 20(11):2715-2744 (2008).

Lazar, et al., "An Overcomplete Stitching Algorithm for Time Decoding Machines", *IEEE Transactions on Circuits and Systems—I*, (11 pages) (2008).

Lazar, et al., "Fast Recovery Algorithms for Time Encoded Bandlimited Signals", *Proceeding of the International Conference on acoustics, Speech and Signal Processing (ICASSP '05)*, Philadelphia, PA, Mar. 19-23, 2005, 4:237-240 (2005).

Lee, "Image Representation using 2D Gabor Wavelets", *IEEE Transactions on Pattern Analysis and Machine Intelligence*, 18(10):959-971 (1996).

Lichtsteiner, et al., "A 128X128 120db 15 μs Latency Asynchromous Temporal Contrast Vision Sensor", *IEEE Journal of solid-State Circuits*, 43(2):566-576 (2008).

Masland, "The Fundamental Plan of the Retina", *Nature Neuroscience*, 4(9):877-886 (2001).

MIT-BIH Arrhythmia Database, http://www.physionet.org/physiobank/database/mitd Retrieved on Aug. 5, 2008 (3 pages).

Olshausen, "Sparse Codes and Spikes", In R.P.N. Rao, B.A. Olshausen and M.S. Lewicki, editors, Probabilistic Models of Perception and Brian Function, MIT Press, (15 pages) (2002).

Olshausen, et al., "Sparse Coding with an Overcomplete Basis Set: A Strategy Employed by V1?", *Vision research*, 37(23):3311-3325 (1997).

Ouzounov, et al., "Analysis and Design of High-Performance Asynchronous Sigma-Delta Modulators with a Binary Quantizer", *IEEE Journal of Solid-State Circuits*, 41(3):588-596 (2006).

Papoulis, "Generalized Sampling Expansion", *IEEE Transactions on Circuits and Systems*, CAS-24(11):652-654 (1977).

"Parks-McClellan FIR filter Design" (Java 1.1 version) http://www.dsptutor.freeuk.com/remez/RemezFIRFilterDesign.htlm. Retrieved on Aug. 5, 2008.

Patterson, et al., "Complex Sounds and Auditory Images", *Advances in the biosciences*, 83:429-446 (1992).

Pillow, et al., "Prediction and Decoding of Retinal Ganglion Cell Responses with a Probabilistic Spiking Model", *The Journal of Neuroscience*, 25(47):11003-11013 (2005).

Roza, "Analog-to-Digital conversion Via Duty-Cycle Modulation", *IEEE Transactions on Circuits and Systems II: Analog and Digital Signal Processing*, 44(11):907-917 (1997).

Sanger, "Neural Population Codes", *Current Opinion in Neurobiology*, 13:238-249 (2003).

Seidner, et al., "Vector Sampling Expansion", *IEEE Transactions on Signal Processing*, 48(5):1401-1416 (2000).

Shang, et al., "Vector Sampling Expansions in shift Invariant Subspaces", *J. Math. Anal. Appl.*, 325:898-919 (2007).

Sheung, "A Continuous-Time Asynchronous Sigma Delta Analog to Digital Converter for Broadband Wireless Receiver with Adaptive Digital Calibration Technique", *PhD Thesis, Department of Electrical and Computer Engineering, Ohio State University*, (137 pages) (2009).

Shinagawa, et al., "A Near-Field-Sensing Transceiver for Intrabody Communication Based on the Electrooptic Effect", *IEEE Transactions on Instrumentation and Measurement*, 53(6):1533-1538 (2004).

(56) References Cited

OTHER PUBLICATIONS

Slaney, "Auditory Toolbox", *Technical Report #1998-010, Interval Research Corporation*, (52 pages) (1998).
Strohmer, "Numerical Analysis of the Non-Uniform Sampling Problem", *Journal of Computational and Applied Mathematics*, 122:297-316 (2000).
Strohmer, "Irregular Sampling, Frames and Pseudoinverse", *Master Thesis, dept. Math. Univ.*, Vienna, Austria, (Abstract) (1991).
Teolis, "Computational signal Processing with Wavelets", *Applied and Numerical Harmonic Analysis*, Chapter 4-6, pp. 59-167 (1998).
Topi, et al., "Spline Recurrent Neural Networks for Quad-Tree Video Coding", *WIRN Vietri, Springer-Verlag, LNCS 2486*, pp. 90-98 (2002).
Venkataramani, et al., "Sampling Theorems for Uniform and Periodic Nonuniform MIMO Sampling of Multiband Signals", *IEEE Transactions on Signal Processing*, 51(12):3152-3163 (2003).
Wei, et al., "Signal Reconstruction from Spiking Neuron Models", *Proceedings of the ISCAS '04*, vol. V:353-356 (May 23-26, 2004).
Wolfram, "Mathematic 5.2", The Mathematica Book Online, http://documents.wolfram.com/mathematica Retrieved on Aug. 5, 2008.
Yang, et al., "A Bio-Inspired Ultra-Energy-Efficient Analog-to-Digital converter for Biomedical Applications", *IEEE Transactions on Circuits and Systems-I: Regular Papers*, 53(11):2349-2356 (2006).
Zimmerman, "Personal Area Networks (PAN): Near-field Intra-Body Communication", *MS Thesis, MIT*, (81 pages) (1995).
Zimmerman, "Personal Area Networks: Near-field Intrabody Communication", *IBM systems Journal*, 35(3&4):609-617 (1996).

* cited by examiner

MULTI-INPUT MULTI-OUTPUT TIME ENCODING AND DECODING MACHINES

CROSS REFERENCE TO RELATED APPLICATIONS

This application is a continuation of Ser. No. 12/645,292, filed Dec. 22, 2009 now U.S. Pat. No. 8,023,046, which is a continuation of International Application PCT/US2008/068790 filed Jun. 30, 2008, which claims priority from: U.S. patent application Ser. No. 11/965,337 filed on Dec. 27, 2007; U.S. Provisional Patent Application No. 60/946,918 filed on Jun. 28, 2007; and U.S. Provisional Patent Application No. 61/037,224 filed on Mar. 17, 2008, the entire disclosures of which are explicitly incorporated by reference herein.

STATEMENT REGARDING FEDERALLY SPONSORED RESEARCH

This invention was made with government support under grants CCF-06-35252, awarded by the National Science Foundation, and R01 DC008701-01, awarded by the National Institutes of Health. The government has certain rights in the invention.

BACKGROUND

1. Field

The present application relates to methods and systems for a Multi-input Multi-output (MIMO) Time Encoding Machines (TEMs) and Time Decoding Machines (TDMs) as well as uses of TEMs and TDMs for encoding and decoding video signals.

2. Background Art

Most signals in the natural world are analog, i.e., cover a continuous range of amplitude values. However, most computer systems for processing these signals are binary digital systems. Generally, synchronous analog-to-digital (A/D) converters are used to capture analog signals and present a digital approximation of the input signal to a computer processor. That is, at precise moments in time synchronized to a system clock, the amplitude of the signal of interest is captured as a digital value. When sampling the amplitude of an analog signal, each bit in the digital representation of the signal represents an increment of voltage, which defines the resolution of the A/D converter. Analog-to-digital conversion is used in numerous applications, such as communications where a signal to be communicated can be converted from an analog signal, such as voice, to a digital signal prior to transport along a transmission line.

Applying traditional sampling theory, a band limited signal can be represented with a quantifiable error by sampling the analog signal at a sampling rate at or above what is commonly referred to as the Nyquist sampling rate. It is a continuing trend in electronic circuit design to reduce the available operating voltage provided to integrated circuit devices. In this regard, power supply voltages for circuits are constantly decreasing. While digital signals can be processed at the lower supply voltages, traditional synchronous sampling of the amplitude of a signal becomes more difficult as the available power supply voltage is reduced and each bit in the A/D or D/A converter reflects a substantially lower voltage increment.

Time Encoding Machines (TEMs) can encode analog information in the time domain using only asynchronous circuits. Representation in the time domain can be an alternative to the classical sampling representation in the amplitude domain. Applications for TEMs can be found in low power nano-sensors for analog-to-discrete (A/D) conversion as well as in modeling olfactory systems, vision and hearing in neuroscience.

SUMMARY

Systems and methods for using MIMO TEMs and TDMs are disclosed herein.

According to some embodiments of the disclosed subject matter, methods for encoding a plurality (M) of components of a signal include filtering each of the M components into a plurality (N) filtered signals and encoding each of the N filtered-signals using at least one Time Encoding Machine (TEM) to generate a plurality (N) of TEM-encoded filtered signals. In some embodiments include the TEM can be an integrate-and-fire neuron, can have multiplicative coupling, and/or can be an asynchronous sigma/delta modulator. In some embodiments, a bias value can be added to each of the N filtered-signals. In some embodiments, the M signals can be irregularly sampled.

In further embodiments, each of the N filtered signals can be represented by the equation $v^j=(h^j)^T*u$, where $h^j=[h^{j1}, h^{j2}, \ldots h^{jM}]^T$ is a filtering vector corresponding to one of the N filtered signals represented by j. In some embodiments, the N TEM-encoded filtered signals can represented by $q_k^j$, where $q_k^j = \kappa^j \delta^j - b^j(t_{k+1}^j - t_k^j)$, for all times represented by a value $k \in \mathbb{Z}$, and each of the N filtered signals represented by a value $j$, $j=1, 2, \ldots N$, where $\kappa^j$ is an integration constant, $\delta^j$ is a threshold value, and $b^j$ is a bias value for each of the N filtered signals.

According to some embodiments of the disclosed subject matter, methods for decoding a TEM-encoded signal include, receiving a plurality (N) of TEM-encoded filtered signals, decoding the N TEM-encoded filtered signals using at least one Time Decoding Machine (TDM) to generate a plurality (N) of TDM-decoded signal components, and filtering each of the N TDM-decoded signal components into a plurality (M) of output signals components. In some embodiments, one of the M output signal components, represented by the i-th component of the vector valued signal u, $|u^i(t)| \leq c^i$, can be recovered by solving for $$u^i(t) = \sum_{j=1}^{N} \sum_{k \in \mathbb{Z}} c_k^j \psi_k^{ji}(t), \text{ where } \psi_k^{ji}(t) = (\tilde{h}^{ji} * g)(t - s_k^j),$$

for all i, i=1, 2, … M, $s_k^j=(t_{k+1}^j+t_k^j)/2$, $\tilde{h}^{ji}$ is the involution of $h^{ji}$, $h^{ji}$ is represented in a TEM-filterbank $$h(t) = \begin{bmatrix} h^{11}(t) & h^{12}(t) & \ldots & h^{1M}(t) \\ h^{21}(t) & h^{22}(t) & \ldots & h^{2M}(t) \\ \vdots & \vdots & \ddots & \vdots \\ h^{N1}(t) & h^{N2}(t) & \ldots & h^{NM}(t) \end{bmatrix},$$

and $[c^j]_k=c_k^j$ $j=1, 2, \ldots N$, where $c=[c^1, c^2, \ldots, c^N]^T$, $c=G^+q$, where $q=[q^1, q^2, \ldots q^N]^T$ and $[q^j]_k=q_k^j$ and $$[G^{ij}]_{kl} = \sum_{m=1}^{M} \int_{c_k^j}^{c_{k+1}^j} h^{im} * \tilde{h}^{jm} * g(t - s_l^j) ds.$$

In some embodiments, the M TEM-encoded signals can be irregularly sampled.

According to some embodiments of the disclosed subject matter, methods for encoding a video stream signal include filtering the video stream signal into a plurality (N) of spatiotemporal field signals, and encoding each of the N spatiotemporal field signals with a Time Encoding Machine to generate a plurality (N) of TEM-encoded spatiotemporal field signals. In some embodiments, the spatiotemporal field signals can be described by an equation: $v^j(t) = \int_{-\infty}^{+\infty} (\iint_X D^j(x, y, s) I(x, y, t-s) dx dy) ds$, where $D^j(x, y, s)$ is a filter function, and $I(x, y, t)$ represents the input video stream.

In some embodiments, the N TEM-encoded spatiotemporal field signals can be represented by a sampling function: $\psi_k^j(x, y, t) = D(x, y, -t) * g(t - s_k^j)$, for k spike times, for each (x, y) in a bounded spatial set, where j corresponds to each of the N TEM-encoded spatiotemporal field signals, and where $g(t) = \sin(\Omega t)/\pi t$.

According to some embodiments of the disclosed subject matter, methods for decoding a TEM-encoded video stream signal include receiving a plurality (N) of TEM-encoded spatiotemporal field signals, decoding each of the N TEM-encoded spatiotemporal field signals using a Time Decoding Machine (TDM) to generate a TDM-decoded spatiotemporal field signal, and combining each of the TDM-decoded spatiotemporal field signals to recover the video stream signal.

In some embodiments, the decoding and combining can be achieved by applying an equation:

$$I(x, y, t) = \sum_{j=1}^{N} \sum_{k \in \mathcal{J}} c_k^j \psi_k^j(x, y, t),$$

where $\psi_k^j(x, y, t) = D(x, y, t) * g(t - s_k^j)$, for k spike times, for each (x, y) in a bounded spatial set, where j corresponds to each of the N TEM-encoded spatiotemporal field signals, and where $g(t) = \sin(\Omega t)/\pi t$, and where $[c^j]_k = c_k^j$ and $c = [c^1, c^2, \ldots c^J]^T$, $c = G^+ q$, where T denotes a transpose, $q = [q^1, q^2, \ldots q^N]^T$, $[q^j]_k = q_k^j$ and $G^+$ denotes a pseudoinverse, a matrix G is represented by $$G = \begin{bmatrix} G^{11} & G^{12} & \ldots & G^{1N} \\ G^{21} & G^{22} & \ldots & G^{2N} \\ \vdots & \vdots & \ddots & \vdots \\ G^{N1} & G^{N2} & \ldots & G^{NN} \end{bmatrix},$$

and $[G^{ij}]_{kl} = \langle D^i(x, y, \bullet) * g(\bullet - t_k^i), D^j(x, y, \bullet) * g(\bullet - t_l^j) \rangle$.

According to some embodiments of the disclosed subject matter, methods of altering a video stream signal include receiving a plurality (N) of TEM-encoded spatiotemporal field signals from a plurality (N) of TEM-filters applying a switching matrix to map the N TEM-encoded spatiotemporal field signals to a plurality (N) of reconstruction filters in a video stream signal TDM. In some embodiments for rotating the video stream signal the switching matrix can map each of the N TEM-encoded spatiotemporal field signals from a TEM-filter ([x,y], $\alpha$, $\theta$) to a reconstruction filter ([x,y], $\alpha$, $\theta + l\theta_0$), where $l\theta_0$ represents a desired value of rotation.

In some embodiments for zooming the video stream signal the switching matrix can map each of the N TEM-encoded spatiotemporal field signals from a TEM-filter ([x,y], $\alpha$, $\theta$) to a reconstruction filter ([x,y], $\alpha_0^m \alpha$, $\theta$), where $\alpha_0^m$ represents a desired value of zoom.

In some embodiments for translating the video stream signal by a value $[nb_0, kb_0]$ the switching matrix can map each of the N TEM-encoded spatiotemporal field signals from a TEM-filter ([x,y], $\alpha$, $\theta$) to a reconstruction filter at ([x+nb_0, y+kb_0], $\alpha$, $\theta$).

In some embodiments for zooming the video stream signal by a value $\alpha_0^m$ and translating the video stream signal by a value $[nb_0, kb_0]$ the switching matrix can map each of the N TEM-encoded spatiotemporal field signals from a TEM-filter ([x,y], $\alpha$, $\theta$) to a reconstruction filter at ([x+$\alpha_0^m nb_0$, y+$\alpha_0^m kb_0$], $\alpha_0^m \alpha$, $\theta$).

According to some embodiments of the disclosed subject matter, methods of encoding a video signal include inputting the video signal into a first and second time encoding machine (TEM), the first TEM including a first TEM-input and a first TEM-output, the second TEM including a second TEM-input and a second TEM-output, wherein the first TEM-output is connected to the first TEM-input and the second TEM-input to provide negative feedback and the second TEM-output is connected to the first TEM-input and the second TEM-input to provide positive feedback.

Some embodiments further include outputting a first set of trigger values from the first TEM according to an equation $$u(t_k^1) = +\delta^1 + \sum_{l<k} h^{11}(t_k^1 - t_l^1) - \sum_l h^{21}(t_k^1 - t_l^2) 1_{\{t_l^2 < t_k^1\}} = q_k^1$$

and outputting a second set of trigger values from the second TEM according to an equation $$u(t_k^2) = -\delta^2 + \sum_{l<k} h^{22}(t_k^2 - t_l^2) - \sum_l h^{12}(t_k^2 - t_l^1) 1_{\{t_l^1 < t_k^2\}} = q_k^2.$$

Yet other embodiments further include outputting a first set of trigger values from the first TEM according to an equation $$\int_{c_k^1}^{c_{k+1}^1} u(s) ds = \kappa^1 \delta^1 - b^1(t_{k+1}^1 - t_k^1) +$$

$$\sum_{l<k} \int_{c_k^1}^{c_{k+1}^1} h^{11}(s - t_l^1) - \sum_l \int_{c_k^1}^{c_{k+1}^1} h^{21}(s - t_l^2) ds 1_{\{t_l^2 < t_k^1\}}$$

and outputting a second set of trigger values from the second TEM according to an equation $$\int_{t_k^2}^{t_{k+1}^2} u(s) ds = \kappa^2 \delta^2 - b^2(t_{k+1}^1 - t_k^1) +$$

$$\sum_{l<k} \int_{t_k^2}^{t_{k+1}^2} h^{22}(s - t_l^2) - \sum_l \int_{t_k^2}^{t_{k+1}^2} h^{12}(s - t_l^1) ds 1_{\{t_l^1 < t_k^2\}}.$$

According to some embodiments of the disclosed subject matter, methods of decoding a video signal include receiving first and second TEM-encoded signals and applying an equation $$u(t) = \sum_{k \in \mathcal{D}} c_k^1 \psi_k^1(t) + \sum_{k \in \mathcal{D}} c_k^2 \psi_k^2(t),$$

where $\psi_k^j(t) = g(t - t_k^j)$, for $j=1, 2$, $g(t) = \sin(\Omega t)/\pi t$, $t \in \mathbb{R}$, $c = [c^1; c^2]$ and $[c^j]_k = c_k^j$, and a vector of coefficients c can be computed as $c = G^+ q$, where $q = [q^1; q^2]$ with $[q^j]_k = q_k^j$ and $$G = \begin{bmatrix} G^{11} & G^{12} \\ G^{21} & G^{22} \end{bmatrix}, \quad [G^{ij}]_{kl} = \langle x_k^i, \psi_l^j \rangle,$$

for all $j=1, 2$, and $k, l \in \mathbb{Z}$.

The accompanying drawings, which are incorporated and constitute part of this disclosure, illustrate preferred embodiments of the disclosed subject matter and serve to explain its principles.

Figure 1:
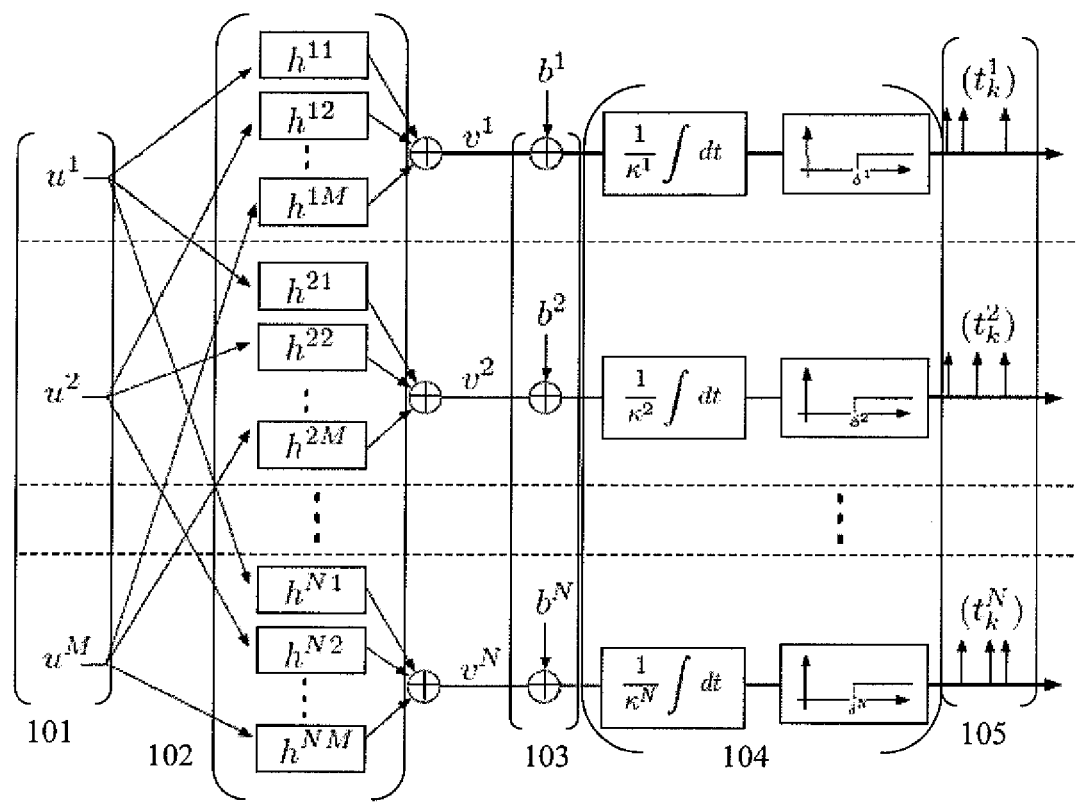
FIG. 1 depicts a multiple input multiple output Time Encoding Machine architecture in accordance with some embodiments of the disclosed subject matter.

Throughout the drawings, the same reference numerals and characters, unless otherwise stated, are used to denote like features, elements, components or portions of the illustrated embodiments. Moreover, while the present disclosed subject matter will now be described in detail with reference to the Figs., it is done so in connection with the illustrative embodiments.

DETAILED DESCRIPTION

Improved systems, methods, and applications of Time Encoding and Decoding machines are disclose herein.

Asynchronous Sigma/Delta modulators as well as FM modulators can encode information in the time domain as described in "Perfect Recovery and Sensitivity Analysis of Time Encoded Bandlimited Signals" by A. A. Lazar and L. T. Toth (*IEEE Transactions on Circuits and Systems-I: Regular Papers*, 51(10):2060-2073, October 2004), which is incorporated by reference. More general TEMs with multiplicative coupling, feedforward and feedback have also been characterized by A. A. Lazar in "Time Encoding Machines with Multiplicative Coupling, Feedback and Feedforward" (*IEEE Transactions on Circuits and Systems II: Express Briefs*, 53(8):672-676, August 2006), which is incorporated by reference. TEMs realized as single and as a population of integrate-and-fire neurons are described by A. A. Lazar in "Multichannel Time Encoding with Integrate-and-Fire Neurons" (*Neurocomputing*, 65-66:401-407, 2005) and "Information Representation with an Ensemble of Hodgkin-Huxley Neurons" (*Neurocomputing*, 70:1764-1771, June 2007), both of which are incorporated by reference. Single-input single-output (SIMO) TEMs are described in "Faithful Representation of Stimuli with a Population of Integrate-and-Fire Neurons" by A. A. Lazar and E. A. Pnevmatikakis (*Neural Computation*), which is incorporated by reference.

Multi-input multi-output (MIMO) TEMs can encode M-dimensional bandlimited signals into N-dimensional time sequences. A representation of M-dimensional bandlimited signals can be generated using an N×M-dimensional filtering kernel and an ensemble of N integrate-and-fire neurons. Each component filter of the kernel can receive input from one of the M component inputs and its output can be additively coupled to a single neuron. (While the embodiments described refer to "neurons," it would be understood by one of ordinary skill that other kinds of TEMs can be used in place of neurons.)

As depicted in FIG. 1, in one embodiment, M components of a signal 101, can be filtered by a set of filters 102. The outputs of the filters can be additively coupled to a set of N TEMs 104 to generated a set of N spike-sequences or trigger times 105.

Let $\Xi$ be the set of bandlimited functions with spectral support in $[-\Omega, \Omega]$. The functions $u^i = u^i(t)$, $t \in \mathbb{R}$, in $\Xi$ can model the M components of the input signal. Without any loss of generality the signal components $(u^1, u^2, \ldots u^M)$ can have a common bandwidth $\Omega$. Further, it can be assumed that the signals in $\Xi$ have finite energy, or are bounded with respect to the $L^2$ norm. Thus $\Xi$ can be a Hilbert space with a norm induced by the inner product in the usual fashion.

$\Xi^M$ can denote the space of vector valued bandlimited functions of the form $u = [u^1, u^2, \ldots, u^M]^T$, where T denotes the transpose. $\Xi^M$ can be a Hilbert space with inner product defined by $$\langle u, v \rangle_{\Xi^M} = \sum_{i=1}^{M} \langle u^i, v^i \rangle_{\Xi} \quad (1)$$

and with norm given by $$\|u\|_{\Xi^M}^2 = \sum_{i=1}^{M} \|u^i\|_{\Xi}^2, \quad (2)$$

where $u = [u^1, u^2, \ldots, u^M]^T \in \Xi^M$ and $v = [v^1, v^2, \ldots, v^M]^T \in \Xi^M$.

We can let $H: \mathbb{R} \mapsto \mathbb{R}^{N \times M}$ be a filtering kernel 102 defined as:

$$H(t) = \begin{bmatrix} h^{11}(t) & h^{12}(t) & \cdots & h^{1M}(t) \\ h^{21}(t) & h^{22}(t) & \cdots & h^{2M}(t) \\ \vdots & \vdots & \ddots & \vdots \\ h^{N1}(t) & h^{N2}(t) & \cdots & h^{NM}(t) \end{bmatrix} \quad (3)$$

where it can be assumed that $\text{supp}(\hat{h}^{ij}) \supseteq [-\Omega, \Omega]$, for all i, i=1, 2, ..., M and all j, j=1, 2, ... N (supp denoting the spectral support and ^ denotes the Fourier transform). Filtering the signal u with the kernel H can lead to an N-dimensional vector valued signal v defined by:

$$v \triangleq H * u = \begin{bmatrix} \sum_{i=1}^{M} h^{1i} * u^i \\ \sum_{i=1}^{M} h^{2i} * u^i \\ \vdots \\ \sum_{i=1}^{M} h^{Ni} * u^i \end{bmatrix}, \quad (4)$$

where * denotes the convolution. Equation (4) can be written as $$v^j = (h^j)^T * u, \, j=1, 2, \ldots N \quad (5)$$

where $h^j = [h^{j1}, h^{j2}, \ldots h^{jM}]^T$ is the filtering vector of the neuron, or TEM, j=1, 2, ... N. A bias $b^j$ 103 can be added to the component $v^j$ of the signal v and the sum can be passed through an integrate-and-fire neuron with integration constant $\kappa^j$ and threshold $\delta^j$ for all j, j=1, 2, ..., N. The value $(t_k^j)$, $k \in \mathbb{Z}$ can be the sequence of trigger (or spike) times 105 generated by neuron j, j=1, 2, ..., N. In sum, the TEM depicted in FIG. 1 can map the input bandlimited vector u into the vector time sequence $(t_k^j)$, $k \in \mathbb{Z}$, j=1, 2, ..., N.

In some embodiments the t-transform can describe the input/output relationship of the TEM, or the mapping of the stimulus $u(t), t \in \mathbb{R}$, into the output spike sequence $(t_k^j), k \in \mathbb{Z}$, j=1, 2, ..., N. The t-transform for the j-th neuron can be written as $$\int_{t_k^j}^{t_{k+1}^j} (v^j(s) + b^j) ds = \kappa^j \delta^j, \text{ or} \quad (6)$$

$$\sum_{i=1}^{M} \int_{t_k^j}^{t_{k+1}^j} (h^{ji} * u^i)(s) ds = q_k^j, \quad (7)$$

where $q_k^j = \kappa^j \delta^j - b^j(t_{k+1}^j - t_k^j)$, for all $k \in \mathbb{Z}$, and j=1, 2, ... N.

Figure 2:
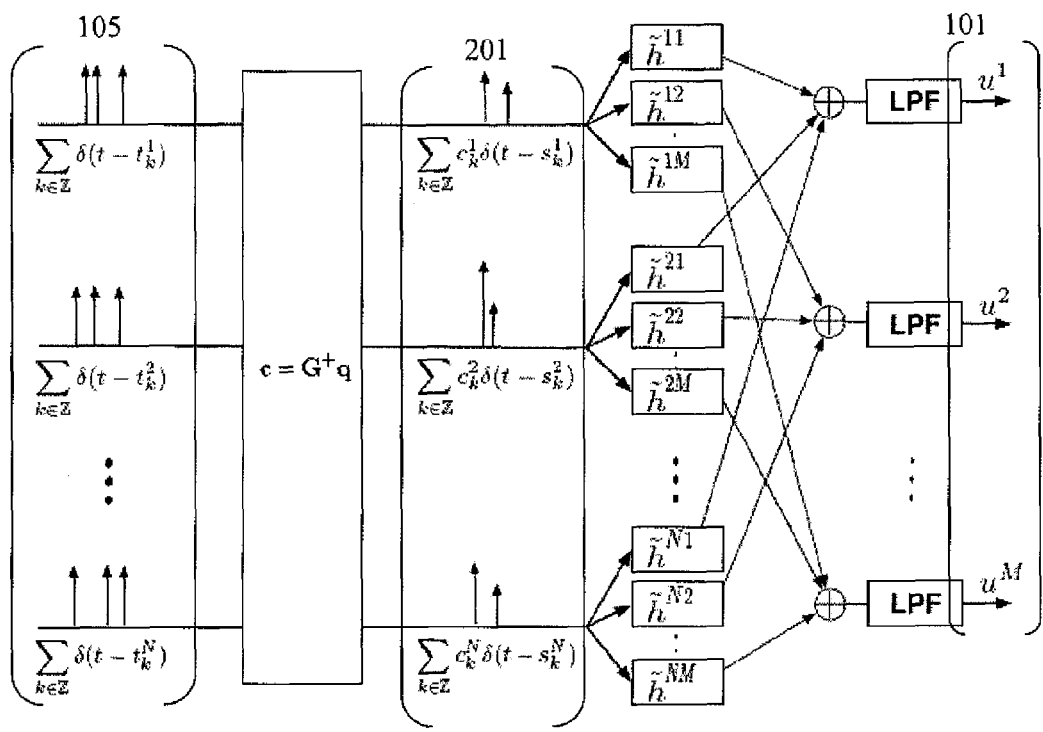
FIG. 2 depicts a multiple input multiple output Time Decoding Machine Architecture in accordance with some embodiments of the disclosed subject matter.

In some embodiments, as depicted in FIG. 2, recovering the stimuli or signal that was encoded 105 can be achieved by seeking the inverse of the t-transform 201. We can let $g(t) = \sin(\Omega t)/\pi t$, $t \in \mathbb{R}$, be the impulse response of a low pass filter (LPF) with cutoff frequency at $\Omega$. From Equation (5) $v^j \in \Xi$ and therefore the t-transform defined by Equation (7) can be written in an inner-product form as:

$$\sum_{i=1}^{M} \langle h^{ji} * u^i, g * 1_{[t_k^j, t_{k+1}^j]} \rangle = q_k^j \Leftrightarrow \text{or} \quad (8)$$

$$\sum_{i=1}^{M} \langle u^i, \tilde{h}^{ji} * g * 1_{[t_k^j, t_{k+1}^j]} \rangle = q_k^j$$

where $\tilde{h}^{ji}$ is the involution of $h^{ji}$. From Equality (8) we can say that stimulus $u = (u^1, u^2, \ldots, u^M)^T$ can be measured by projecting it onto the sequence of functions $(\tilde{h}^{ji} * g * 1_{[t_k^j, t_{k+1}^j]})$, $k \in \mathbb{Z}$, and j=1, 2, ... N. The values of the measurements, $q_k^j$, $k \in \mathbb{Z}$, and j=1, 2, ... N, are available for recovery. Thus the TEM can act as a sampler of the stimulus u, and because the spike times can depend on the stimulus, the TEM can act as a stimulus dependent sampler.

With $(t_k^j)$, $k \in \mathbb{Z}$, the spike times of neuron j, the t-transform, as shown in Equation (8), can be written in an inner product form as $$q_k^j = \langle u, \phi_k^j \rangle \quad (9)$$

where $$\phi_k^j = \tilde{h}^j * g * 1_{[t_k^j, t_{k+1}^j]} = \begin{bmatrix} \tilde{h}^{j1} \\ \tilde{h}^{j2} \\ \vdots \\ \tilde{h}^{jM} \end{bmatrix} g * 1_{[t_k^j, t_{k+1}^j]} \quad (10)$$

for all $k \in \mathbb{Z}$, j=1, 2, ... N, $t \in \mathbb{R}$.

The stimulus u 101 can be recovered from Equation (9) if $\phi = \phi_k^j$, where $k \in \mathbb{Z}$, j=1, 2, ..., N, is a frame for $\Xi^M$. Signal recover algorithms can be obtained using the frame $\psi = (\psi_k^j)$, $k \in \mathbb{Z}$, j=1, 2, ... N, where $$\psi_k^j(t) = (\tilde{h}^j * g)(t - s_k^j), \quad (11)$$

and $s_k^j = (t_{k+1}^j + t_k^j)/2$.

A filtering kernel H can be said to be BIBO stable if each of the filters $h^{ji} = h^{ji}(t)$, $t \in \mathbb{R}$, j=1, 2, ... N, and i=1, 2, ..., M, is bounded-input bounded-output stable, i.e., $$\|h^{ji}\|_1 \triangleq \int_{\mathbb{R}} |h^{ji}(s)| ds < \infty.$$

Filtering vectors $h^j = [h^{j1}, h^{j2}, \ldots h^{jM}]^T$, j=1, 2, ..., N, can be said to be BIBO stable if each of the components $h^{ji}$, i=1, 2, ... M, is BIBO stable. Further, if $\hat{H}: \mathbb{R} \to \mathbb{C}^{N \times M}$ is the Fourier transform of the filtering kernel H, then $[\hat{H}(w)]^{nm} = \int_{\mathbb{R}} h^{nm}(s) \exp(-iws) ds$, for all n=1, 2, ..., N, and m=1, 2, ... M, where $i = \sqrt{-1}$. The filtering vectors $h^j$ can be said to have full spectral support if $\text{supp}(\hat{h}^{ij}) \supseteq [-\Omega, \Omega]$, for all i, i=1, 2, ... M. A BIBO filtering kernel H can be said to be invertible if $\hat{H}$ has rank M for all $w \in [-\Omega, \Omega]$. Filtering vectors $(h^j)$, j=1, 2, ..., N, can be called linearly independent if there do not exist real numbers $a_j$, j=1, 2, ... N, not all equal to zero, and real numbers $\alpha^j$, j=1, 2, ... N, such that $$\sum_{j=1}^{N} a_j (h^j * g)(t - \alpha^j) = 0$$

for all t, t ∈ ℝ (except on a set of Lebesgue-measure zero).

Assuming that the filters $h^j = h^j(t)$, t ∈ ℝ, are BIBO stable, linearly independent and have full spectral support for all j, j=1, 2, ... N, and that matrix H is invertible, then the M-dimensional signal $u=[u^1, u^2, \ldots, u^M]^T$ can be recovered as $$u(t) = \sum_{j=1}^{N} \sum_{k \in \partial} c_k^j \psi_k^j(t), \quad (12)$$

where $c_k^j$, k ∈ ℤ, j=1, 2, ... N are suitable coefficients provided that:

$$\sum_{j=1}^{N} \frac{b^j}{\kappa^j \delta^j} \geq M \frac{\Omega}{\pi} \quad (13)$$

and $|u^i(t)| < c^i$, i=1, 2, ... M.

Letting $[c^j]_k = c_k^j$ and $c = [c^1, c^2, \ldots c^1]^T$, the coefficients c can be computed as $$c = G^+ q \quad (14)$$

202 where T denotes the transpose, $q = [q^1, q^2, \ldots q^N]^T$, $[q^j]_k = q_k^j$ and $G^+$ denotes the pseudoinverse. The entries of the matrix G can be given by $$G = \begin{bmatrix} G^{11} & G^{12} & \ldots & G^{1N} \\ G^{21} & G^{22} & \ldots & G^{2N} \\ \vdots & \vdots & \ddots & \vdots \\ G^{N1} & G^{N2} & \ldots & G^{NN} \end{bmatrix}, \quad (15)$$

$$[G^{ij}]_{kl} = \langle \psi_l^j, \phi_k^i \rangle$$
$$= \sum_{m=1}^{M} \int_{t_k^i}^{t_{k+1}^i} h^{im} * \tilde{h}^{jm} * g(t - s_l^j) ds$$

for all i=1, 2, ..., N, j=1, 2, ..., N, k ∈ ℤ, l ∈ ℤ.

Assume that the filtering vectors $h^j = h^j(t)$, are BIBO stable, linearly independent and have full spectral support for all j, j=1, 2, ... N, and that matrix H is invertible. If $\Sigma_{j=1}^{N} b^j / \kappa^j \delta^j$ diverges in N, then there can exist a number $N$ such that for all N ≥ $N$, the vector valued signal u can be recovered as $$u(t) = \sum_{j=1}^{N} \sum_{k \in \partial} c_k^j \psi_k^j(t) \quad (16)$$

and the $c_k^j$, k ∈ ℤ, j=1, 2, ... N, are given in the matrix form by $c = G^+ q$.

Figure 3:
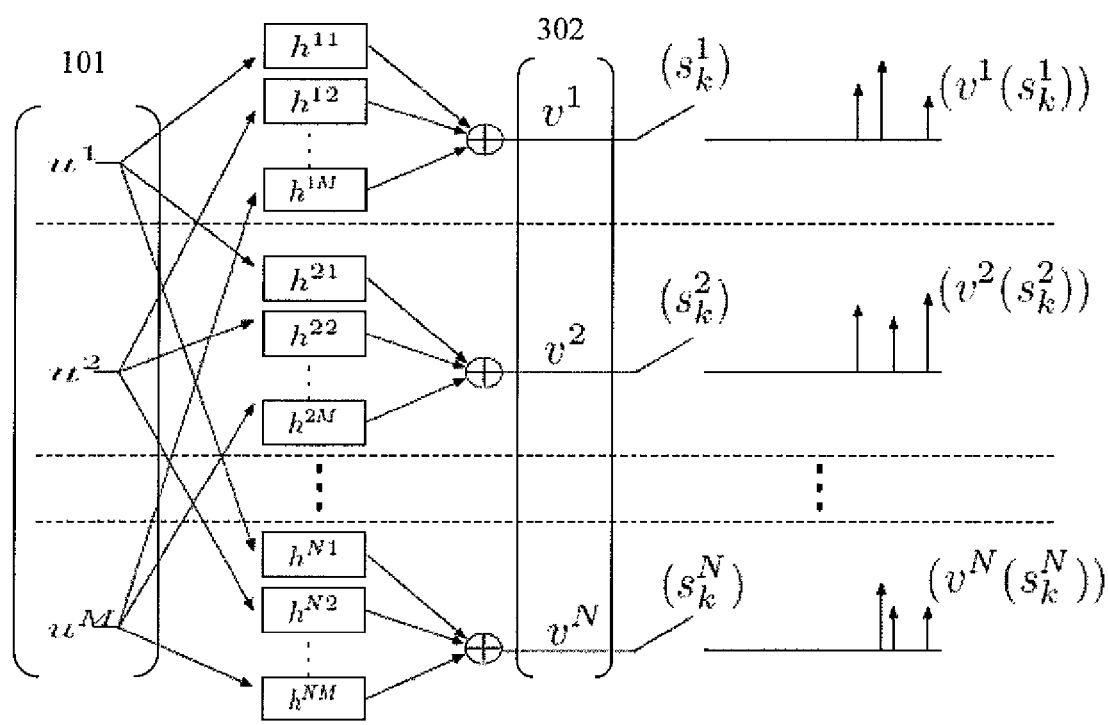
FIG. 3 depicts a multiple input multiple output irregular sampling architecture in accordance with some embodiments of the disclosed subject matter.

In some embodiments, the previously disclosed Multiple-Input-Multiple-Output scheme can be applied to an Irregular Sampling problem, as depicted in FIG. 3. While similar to the previously disclosed MIMO-TEM, integrate-and-fire neurons can be replaced by irregular (amplitude) samplers.

The samples for each signal 302 $v^j = h^{j1} * u^1 + h^{j2} * u^2 + \ldots + h^{jM} * u^M$ at times ($s_k^j$)), k ∈ ℤ, j=1, 2, ... N, respectively can be recovered and $s_k = (t_{k+1} + t_k)/2$, k ∈ ℤ.

As with previous embodiments, assuming that the filtering vectors $h^j$ are BIBO stable for all j=1, 2, ... N, and that H is invertible, the vector valued signal u, sampled with the circuit of FIG. 3, can be recovered as:

$$u(t) = \sum_{j=1}^{N} \sum_{k \in \partial} c_k^j \phi_k^j(t) \quad (17)$$

provided that $$D > M \frac{\Omega}{\pi}$$

holds, where D is the total lower density. Further for $[c^j]_k = c_k^j$ and $c = [c^1, c^2, \ldots c^N]^T$, the vector of coefficients c can be computed as $c = G^+ q$, where $q = [q^1, q^2, \ldots, q^N]^T$ and $[q^j]_k = q_k^j$. The entries of the G matrix can be given by:

$$[G^{ij}]_{kl} = \langle \phi_l^j, \psi_k^i \rangle \quad (18)$$
$$= \sum_{m=1}^{M} \left( h^{im} * \tilde{h}^{jm} * g * 1_{[t_j^i, t_{i+1}^j]} \right)(s_k^i).$$

In other embodiments, assuming that the filtering vectors $h^j$ are BIBO stable and have full spectral support for all j=1, 2, ... N and that H is invertible, the vector valued signal u, sampled with the circuit of FIG. 3, can be recovered as $$u = \Sigma_{j=1}^{N} \Sigma_{k \in \partial} c_k^j \psi_k^j(t) \quad (19).$$

provided that $$D > M \frac{\Omega}{\pi}$$

holds where D is the total lower density. Further for $[c^j]_k = c_k^j$ and $c = [c^1, c^2, \ldots c^N]^T$, the vector of coefficients c can be computed as $c = G^+ q$, where $q = [q^1, q^2, \ldots q^N]^T$ and $[q^j]_k = q_k^j$. The entries of the G matrix can be given by:

$$[G^{ij}]_{kl} = \langle \psi_l^j, \psi_k^i \rangle = \sum_{m=1}^{M} (h^{im} * \tilde{h}^{jm} * g)(s_k^i - s_l^j). \quad (20)$$

In some embodiments, TEMs and TDMs can be used to encode and decode visual stimuli such as natural and synthetic video streams, for example movies or animations. Encoding and decoding visual stimuli is critical for, among other reasons, the storage, manipulation, and transmission of visual stimuli, such as multimedia in the form of video. Specifically, the neuron representation model and its spike data can be used to encode video from its original analog format into a "spike domain" or time-based representation; store, transmit, or alter such visual stimuli by acting on the spike domain representation; and decode the spike domain representation into an alternate representation of the visual stimuli, e.g., analog or digital. Moreover, in "acting" on the visual stimuli through use of the spike domain, one can dilate (or zoom) the visual stimuli, translate or move the visual stimuli, rotate the visual stimuli, and perform any other linear operation or transformation by acting or manipulating the spike domain representation of the visual stimuli.

Widely used modulation circuits such as Asynchronous Sigma/Delta Modulators and and FM modulators have been shown to be instances of TEMs by A. A. Lazar and E. A. Pnevmatikakis in "A Video Time Encoding Machine" (*IEEE International Conference on Image Processing*, San Diego, Calif., Oct. 12-15, 2008), which is incorporated by reference. TEMs based on single neuron models such as integrate-and-fire (IAF) neurons, as described by A. A. Lazar in "Time Encoding with an Integrate-and-Fire Neuron with a Refractory Period" (*Neurocomputing*, 58-60:53-58, June 2004), which is incorporated by reference, and more general Hodgkin-Huxley neurons with multiplicative coupling, feedforward and feedback have been described by A. A. Lazar in "Time Encoding Machines with Multiplicative Coupling, Feedback and Feedforward," which was incorporated by reference above. Multichannel TEMs realized with invertible filterbanks and invertible IAF neurons have been studied by A. A. Lazar in "Multichannel Time Encoding with Integrate-and-Fire Neurons," which is incorporated by reference above, and TEMs realized with a population of integrate-and-fire neurons have been investigated by A. A. Lazar in "Information Representation with an Ensemble of Hodgkin-Huxley Neurons," which was incorporated by reference above. An extensive characterization of single-input single-output (SIMO) TEMs can be found in A. A. Lazar and E. A. Pnevmatikakis' "Faithful Representation of Stimuli with a Population of Integrate-and-Fire Neurons," which is incorporated by reference above.

Figure 8:
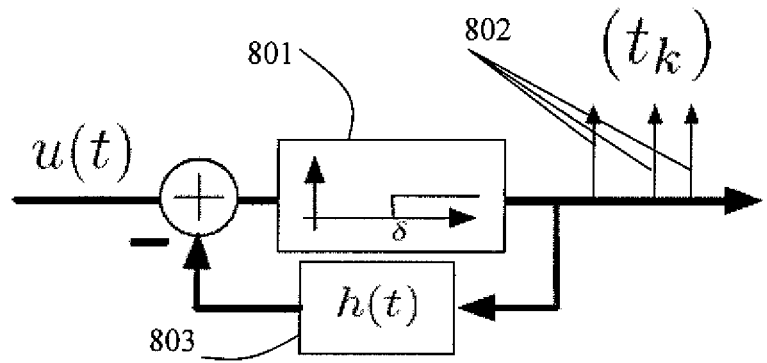
FIG. 8 depicts a time encoding circuit in accordance with some embodiments of the disclosed subject matter.

FIG. 8 depicts an embodiment of a time encoding circuit. The circuit can model the responses of a wide variety of retinal ganglion cells (RGCs) and lateral geniculate nucleus (LGN) neurons across many different organisms. The neuron can fire whenever its membrane potential reaches a fixed threshold $\delta$ 801. After a spike 802 is generated, the membrane potential can reset through a negative feedback mechanism 803 that gets triggered by the just emitted spike 802. The feedback mechanism 803 can be modeled by a filter with impulse response $h(t)$.

As previously described, TEMs can act as signal dependent samplers and encode information about the input signal as a time sequence. As described in "Perfect Recovery and Sensitivity Analysis of Time Encoded Bandlimited Signals" by A. A. Lazar and László T. Tóth, which is incorporated by reference above, this encoding can be quantified with the t-transform which describes in mathematical language the generation of the spike sequences given the input stimulus. This time encoding mechanism can be referred to as a single neuron TEM. Where $(t_k)$, $k \in \mathbb{R}$, is the set of spike times of the output of the neuron, the t-transform of the TEM depicted in FIG. 1 can be written as $$u(t_k) = \delta + \sum_{l<k} h(t_k - t_l). \quad (21)$$

Equation (21) can be written in inner product form as $$<u, X_k> = q_k, \quad (22)$$

where $$q_k = u(t_k) = \delta + \sum_{l<k} h(t_k - t_l),$$

$X_k(t)=g(t-t_k)$, $k \in \mathbb{Z}$, and $g(t)=\sin(\Omega t)/\pi t$, $t \in \mathbb{R}$, is the impulse response of a low pass filter with cutoff frequency $\Omega$. The impulse response of the filter in the feedback loop can be causal, and can be decreasing with time.

Figure 9:
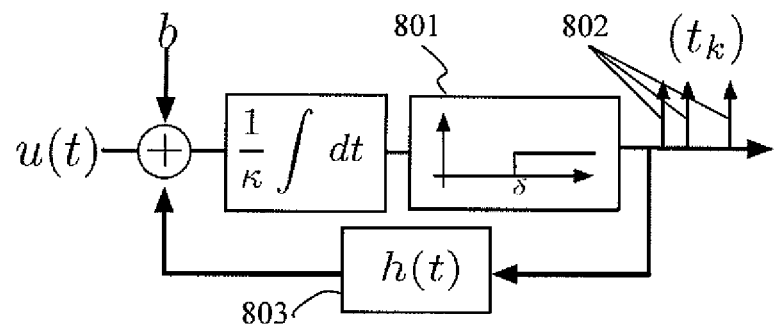
FIG. 9 depicts a single neuron encoding circuit that includes an integrate-and-fire neuron with feedback in accordance with some embodiments of the disclosed subject matter.

FIG. 9 depicts an embodiment of a single neuron encoding circuit that includes an integrate-and-fire neuron with feedback. The t-transform of the encoding circuit can be written as $$\int_{t_k}^{t_{k+1}} u(s)ds = \kappa\delta - b(t_{k+1} - t_k) - \sum_{l<k} \int_{t_k}^{t_{k+1}} h(s - t_l)ds, \quad (23)$$

or in inner product form as $$<u, X_k>=q_k, \quad (24)$$

with $$q_k = \kappa\delta - b(t_{k+1} - t_k) - \sum_{l<k} \int_{t_k}^{t_{k+1}} h(s - t_l)ds$$

and $X_k(t)=g*1_{[t_k,t_{k+1}]}$, for all $k$, $k \in \mathbb{Z}$.

In some embodiments, the bandlimited input stimulus u can be recovered as $$u(t) = \sum_{k \in \mathcal{I}} c_k \psi_k(t), \quad (25)$$

where $\psi_k(t)=g(t-t_k)$, provided that the spike density of the neuron is above the Nyquist rate $\Omega/\pi$. For $[c]_k=c_k$, the vector of coefficients c can be computed as $c=G^+q$, where $G^+$ denotes the pseudoinverse of G, $[q]_k=q_k$ and $[G]_{kl}=<X_k, \psi_l>$.

Figure 10:
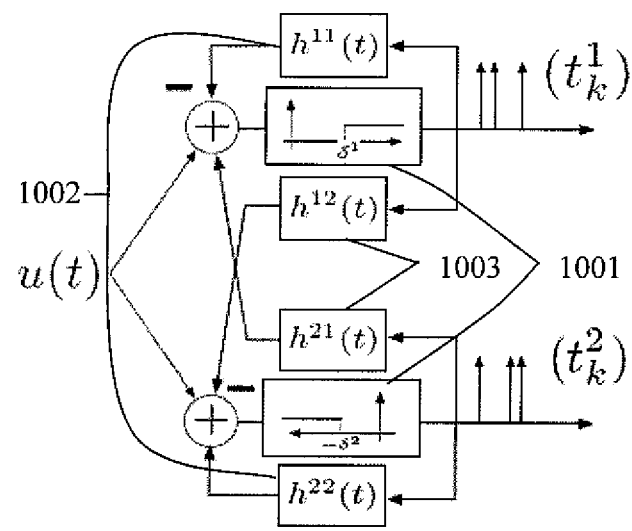
FIG. 10 depicts two interconnected ON-OFF neurons each with its own feedback in accordance with some embodiments of the disclosed subject matter.

FIG. 10 depicts an embodiment consisting of two interconnected ON-OFF neurons each with its own feedback. Each neuron can be endowed with a level crossing detection mechanism 1001 with a threshold $\delta$ that takes a positive value 1 and a negative value 2, respectively. Whenever a spike is emitted, the feedback mechanism 1002 can reset the corresponding membrane potential. In addition, each spike can be communicated to the other neuron through a cross-feedback mechanism 1003. In general, this cross-feedback mechanism can bring the second neuron closer to its firing threshold and thereby increases its spike density. The two neuron model in FIG. 10 can mimic the ON and OFF bipolar cells in the retina and their connections through the non-spiking horizontal cells. This time encoding mechanism can be described as an ON-OFF TEM.

For the TEM depicted in FIG. 10, with $(t_k^j)$, $k \in \mathbb{Z}$ representing the set of spike times of the neuron j, the t-transform of the ON-OFF TEM can be described by the equations $$u(t_k^1) = +\delta^1 + \sum_{l<k} h^{11}(t_k^1 - t_l^1) - \sum_l h^{21}(t_k^1 - t_l^2)1_{\{t_l^2<t_k^1\}} = q_k^1 \quad (26)$$

$$u(t_k^2) = -\delta^2 + \sum_{l<k} h^{22}(t_k^2 - t_l^2) - \sum_l h^{12}(t_k^2 - t_l^1)1_{\{t_l^1<t_k^2\}} = q_k^2,$$

for all k, k ∈ $\mathbb{Z}$. The equations (31) can be written in inner product form as $$<u, x_k^j> = q_k^j \quad (27)$$

for all k, k ∈ $\mathbb{Z}$, j, j=1, 2, where $x_k^j(t)=g(t-t_k^j)$, j=1, 2.

Figure 11:
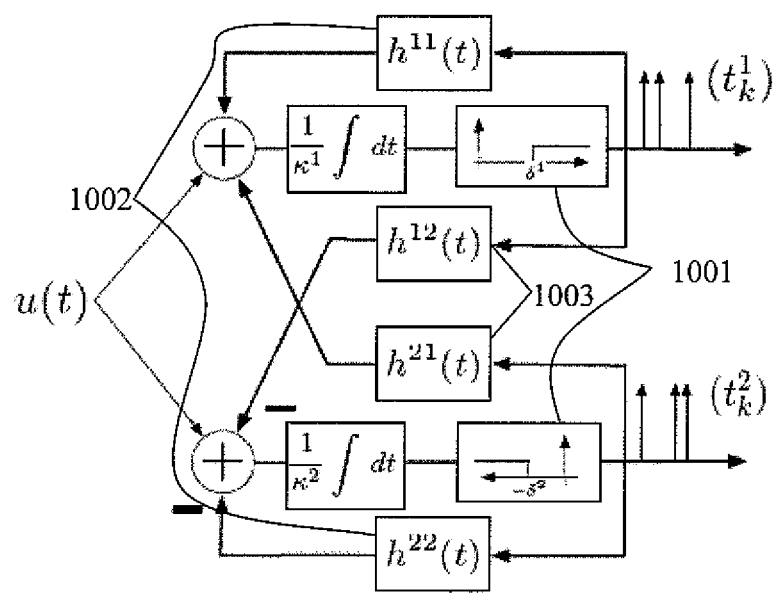
FIG. 11 depicts two interconnected ON-OFF neurons each with its own feedback in accordance with some embodiments of the disclosed subject matter.

FIG. 11 depicts an embodiment consisting of two interconnected ON-OFF neurons each with its own feedback. The t-transforms of the neurons depicted in FIG. 11 can be described by the equations $$\int_{t_k^1}^{t_{k+1}^1} u(s)ds = \kappa^1\delta^1 - b^1(t_{k+1}^1 - t_k^1) + \quad (28)$$

$$\sum_{l<k}\int_{t_k^1}^{t_{k+1}^1} h^{11}(s-t_l^1) - \sum_l \int_{t_k^1}^{t_{k+1}^1} h^{21}(s-t_l^2)ds1_{\{t_l^2<t_k^1\}}$$

$$\int_{t_k^2}^{t_{k+1}^2} u(s)ds = \kappa^2\delta^2 - b^2(t_{k+1}^1 - t_k^1) + \sum_{l<k}\int_{t_k^2}^{t_{k+1}^2} h^{22}(s-t_l^2) -$$

$$\sum_l \int_{t_k^2}^{t_{k+1}^2} h^{12}(s-t_l^1)ds1_{\{t_l^1<t_k^2\}},$$

or in inner product form as $$<u, x_k^j> = q_k^j \quad (29)$$

with $$q_k^j = \int_{t_k^j}^{t_{k+1}^j} u(s)ds,$$

for all k, k ∈ $\mathbb{Z}$, j, j=1, 2.

In some embodiments, the input stimulus u can be recovered as $$u(t) = \sum_{k \in \mathcal{J}} c_k^1 \psi_k^1(t) + \sum_{k \in \mathcal{J}} c_k^2 \psi_k^2(t), \quad (30)$$

where $\psi_k^j(t)=g(t-t_k^j)$, j=1, 2, provided that the spike density of the TEM is above the Nyquist rate $\Omega/\pi$. Moreover with $c=[c^1; c^2]$ and $[c^j]_k=c_k^j$, the vector of coefficients c can be computed as $c=G^+q$, where $q=[q^1; q^2]$ with $[q^j]_k=q_k^j$ and $$G = \begin{bmatrix} G^{11} & G^{12} \\ G^{21} & G^{22} \end{bmatrix}, \quad [G^{ij}]_{kl} = \langle x_k^i, \psi_l^j \rangle,$$

for all j=1, 2, and k, l ∈ $\mathbb{Z}$.

Figure 4:
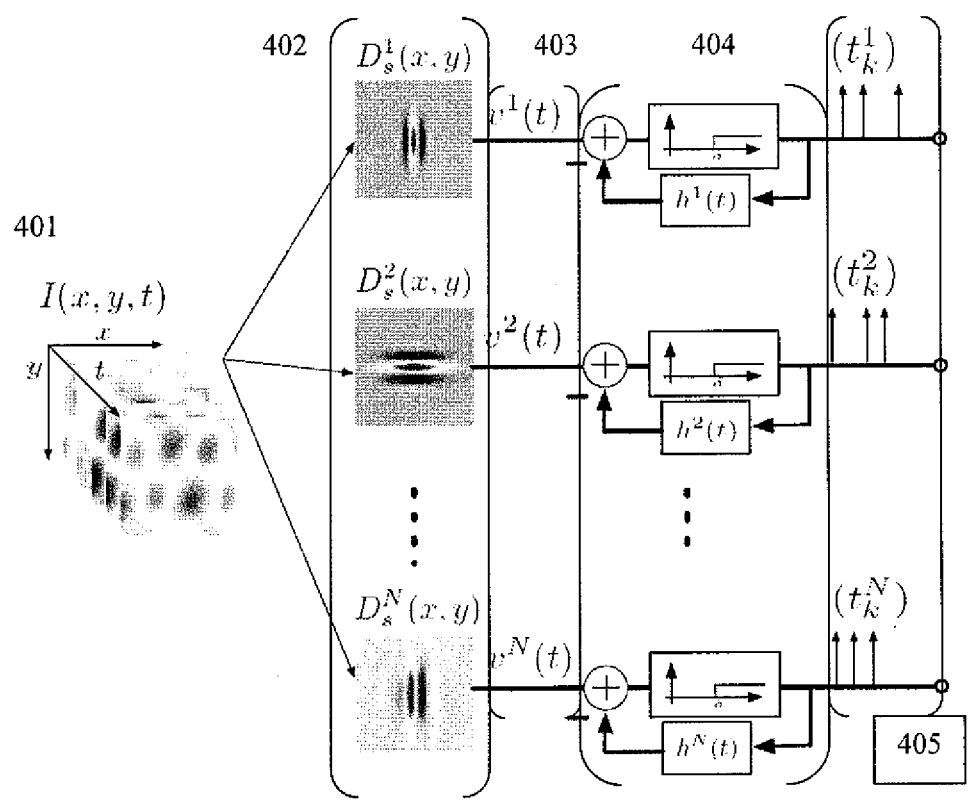
FIG. 4 depicts a video stream encoding device in accordance with some embodiments of the disclosed subject matter.

In one embodiment, as depicted in FIG. 4, let $\mathcal{H}$ denote the space of (real) analog video streams I(x, y, t) 401 which are bandlimited in time, continuous in space, and have finite energy. Assume that the video streams are defined on bounded spatial set X which is a compact subset of $\mathbb{R}^2$. Bandlimited in time can mean that for every $(x_0, y_0) \in X$ then $I(x_0, y_0, y) \in \Xi$, where $\Xi$ is the space of bandlimited functions of finite energy. In some embodiments, $\mathcal{H}=\{I=I(x,y,t)|I(x_0, y_0, t) \in \Xi, \forall(x_0, y_0) \in X$ and $I(x,y,t_0) \in L^2(X), \forall t_0 \in \mathbb{R})\}$. The space $\mathcal{H}$, endowed with the inner product $<\bullet,\bullet>$:H $\mapsto \mathbb{R}$ defined by:

$$<I_1, I_2> = \iiint_{\mathbb{R} \otimes X} I_1(x,y,t)I_2(x, y, t)dxdydt \quad (31)$$

can be a Hilbert space.

Assuming that each neuron or TEM j, j=1, 2, ... N has a spatiotemporal receptive field described by the function $D^j(x, y, t)$ 402, filtering a video stream with the receptive field of the neuron j gives the output $v^j(t)$ 403, which can serve as the input to the TEM 404:

$$v^j(t) = \int_{-\infty}^{+\infty}(\iint_X D^j(x,y,s)I(x,y,t-s)dxdy)ds. \quad (32)$$

In some embodiments, the receptive fields of the neurons can have only spatial components, i.e. $D^j(x,y,t)=D_s^j(x,y)\delta(t)$, where $\delta(t)$ is the Dirac function.

Where $t_k^j$, k ∈ $\mathbb{Z}$ represents the spike time of neuron j, j=1, 2, ... N, the t-transform can be written as $$v^j(t_k^j) = \delta^j + \sum_{l<k} h(t_k^j - t_l^j).$$

In inner product form, this can be written as $<I, \psi_k^j> = q_k^j$ with $q_k^j = \delta^j + \Sigma_{l<k}h(t_k^j - t_l^j)$. The sampling function can be given by $\psi_k^j(x,y,t) = \tilde{D}^j(x,y,t)*g(t-s_k^j)$ where $\tilde{D}^j(x,y,t)=D^j(x,y,-t)$. In embodiments with only spatial receptive fields, the sample functions can be written as $\phi_k^j(x,y,t)=D_s^j(x,y)*g(t-s_k^j)$.

Figure 5:
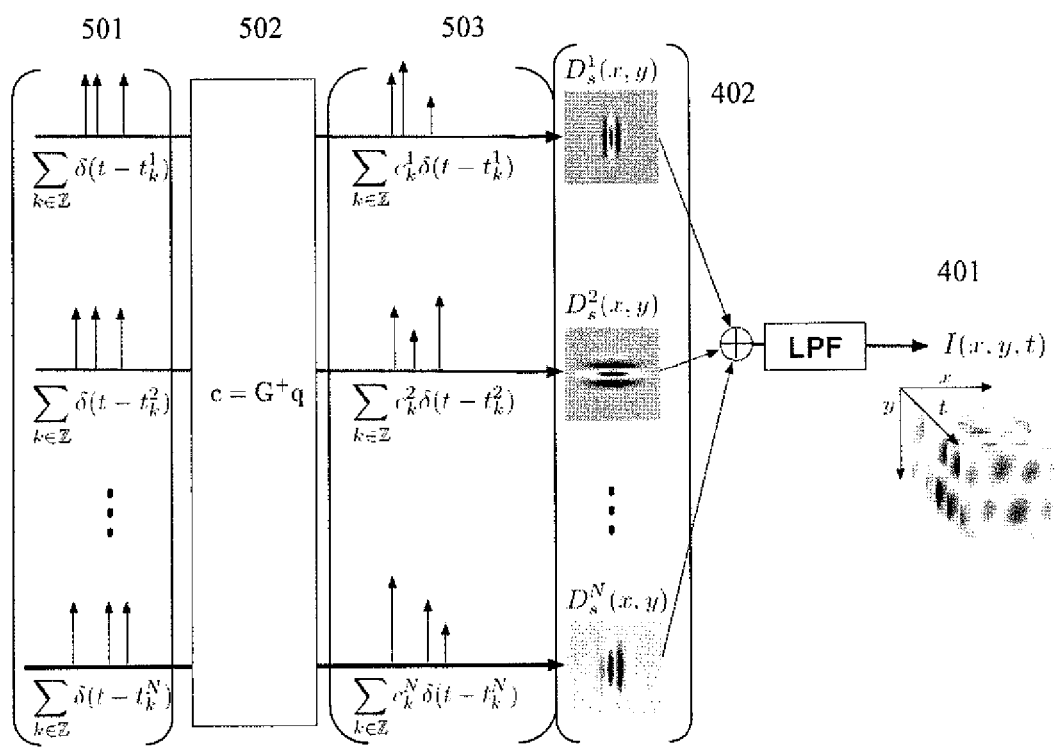
FIG. 5 depicts a video stream decoding device in accordance with some embodiments of the disclosed subject matter.

In some embodiments, as depicted in FIG. 5, decoding the TEM-encoded signal can be recovered using the same frame $\psi_k^j$, j=1, 2, ... N, k ∈ $\mathbb{Z}$, with $\psi_k^j(x,y,t)=D(x,y,t)*g(t-s_k^j)$ 503, 402. Where the filters modeling the receptive fields $D^j(x,y,t)$ are linearly independent and span the whole spatial domain of interest (i.e., for every $t_0 \in \mathbb{R}$, $Dj(x,y,t_0))_j$ forms a frame for $L^2(X)$, if the total spike density diverges in N, then there can exist a number $\mathcal{N}$ such that if $N \geq \mathcal{N}$ then the video stream I=I(x,y,t) can be recovered as $$I(x, y, t) = \sum_{j=1}^{N} \sum_{k \in \mathbb{F}} c_k^j \psi_k^j(x, y, t) \quad (33)$$

503 and $c_k^j$, k ∈ $\mathbb{Z}$, j=1, 2, ..., N, are suitable coefficients.

Letting $[c^j]_k = c_k^j$ and $c=[c^1, c^2, ... c^j]^T$, the coefficients c can be computed as $$c = G^+ q \quad (34)$$

502 where T denotes the transpose, $q=[q^1, q^2, ... q^N]^T$, $[q^j]_k=q_k^j$ and $G^+$ denotes the pseudoinverse. The entries of the matrix G can be given by $$G = \begin{bmatrix} G^{11} & G^{12} & \cdots & G^{1N} \\ G^{21} & G^{22} & \cdots & G^{2N} \\ \vdots & \vdots & \ddots & \vdots \\ G^{N1} & G^{N2} & \cdots & G^{NN} \end{bmatrix},$$

$[G^{ij}]_{kl} = <D^i(x,y,\bullet)*g(\bullet-t_k^i), D^j(x,y,\bullet)*g(\bullet-t_l^j)>$. Where the receptive field is only in the spatial domain, $\psi_k^j(t)=D_s^j(x,y)g(t-s_k^j)$ and $[G^{ij}]_{kl}=(\iint_X D^i(x,y)D^j(x,y)dxdy)g(t_k^i-t_l^j)$.

Figure 6:
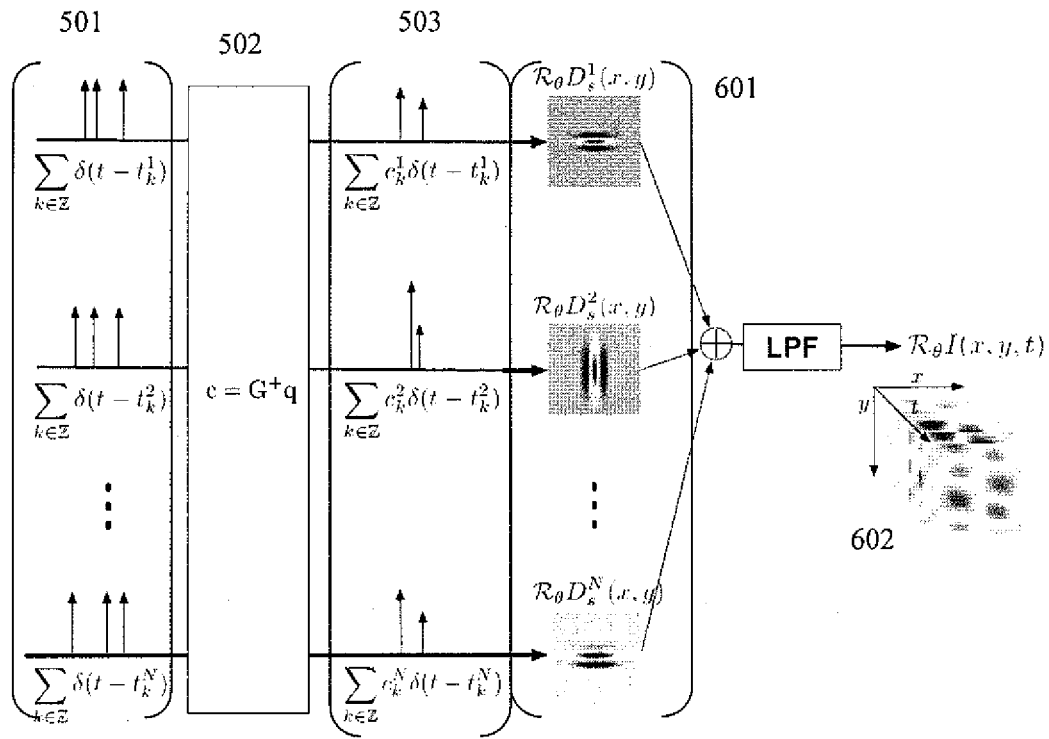
FIG. 6 depicts a second video stream decoding device in accordance with some embodiments of the disclosed subject matter.

In some embodiments, as depicted in FIG. 6, bounded and surjective operations on the elements of a frame can preserve the frame's characteristics. As such, bounded and surjective operations can be performed on the frames while in the spike domain (after being encoded by one or more TEMs and prior to being decoded by one or more TDMs) to alter the characteristics of the video. In accordance with the disclosed subject matter, a method of dilating, translating, and rotating a visual stimuli can be achieved by applying, for example, the following function to the encoded visual stimuli:

$$\psi_{\alpha,x_0,y_0,\theta}(x,y)=\alpha^{-1}R_\theta\psi(a^{-1}x-x_0, a^{-1}y-y_0),$$

601 where $\alpha$ represents the amount of dilation and is a real number not including zero; $x_0$, $y_0$ represents the amount of translation; $\theta$ represents the amount of rotation between 0 and $2\pi$, $R_\theta\psi(x,y)=\psi(x\cos(\theta)+y\sin(\theta),-x\sin(\theta)+y\cos(\theta))$; and $$\psi(x,y) = \frac{1}{\sqrt{2\pi}}\exp\left(-\frac{1}{8}(4x^2+y^2)\right)\left(e^{ikx}-e^{k^2/2}\right).$$

Figure 7:
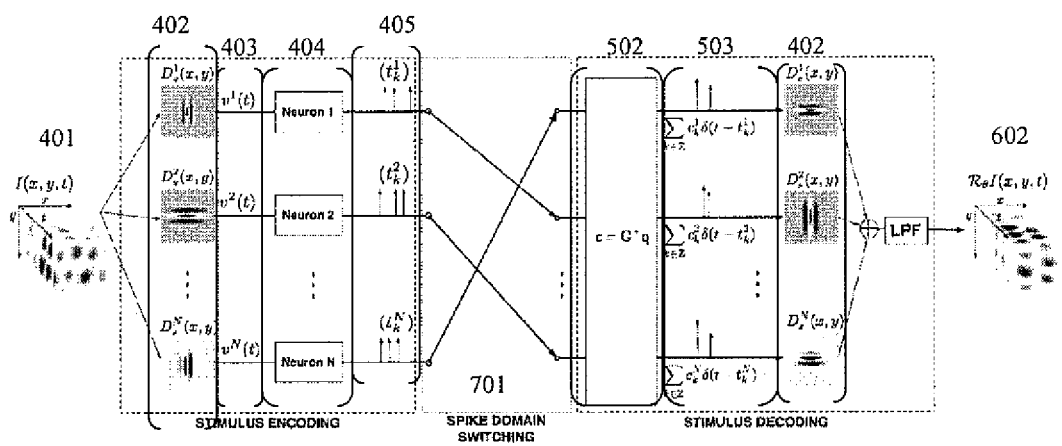
FIG. 7 depicts a video stream encoding and decoding device in accordance with some embodiments of the disclosed subject matter.

In further embodiments, the alterations to the video can be achieved by using a switching-matrix 701, as depicted in FIG. 7. To rotate the video by an angle $l\theta_0$, $l \in \mathbb{Z}$, the spike coming from filter element ($[x,y]$, $\alpha$, $\theta$) can be mapped to the reconstruction filter at ($[x,y]$, $\alpha$, $\theta+l\theta_0$). To dilate, or zoom the video by a value $\alpha_0^m$, $m \in \mathbb{Z}$, the spike coming from filter element ($[x,y]$, $\alpha$, $\theta$) can be mapped to the reconstruction filter at ($[x,y]$, $\alpha_0^m\alpha$, $\theta$). To translate a video by $[nb_0, kb_0]$, the spike coming from filter element ($[x,y]$, $\alpha$, $\theta$) can be mapped to the reconstruction filter at ($[x+nb_0, y+kb_0]$, $\alpha$, $\theta$). To simultaneous dilate by $\alpha_0^m$ and translate by $[nb_0, kb_0]$, then the spike coming from filter element ($[x,y]$, $\alpha$, $\theta$) can be mapped to the reconstruction filter at ($[x+\alpha_0^m nb_0, y+\alpha_0^m kb_0]$, $\alpha_0^m \alpha$, $\theta$).

The disclosed subject matter and methods can be implemented in software stored on computer readable storage media, such as a hard disk, flash disk, magnetic tape, optical disk, network drive, or other computer readable medium. The software can be performed by a processor capable of reading the stored software and carrying out the instructions therein.

The foregoing merely illustrates the principles of the disclosed subject matter. Various modifications and alterations to the described embodiments will be apparent to those skilled in the art in view of the teachings herein. It will thus be appreciated that those skilled in the art will be able to devise numerous techniques which, although not explicitly described herein, embody the principles of the disclosed subject matter and are thus within the spirit and scope of the disclosed subject matter.

We claim:

1. A multiple-input, multiple-output encoder comprising:
   a filtering kernel comprising a plurality (N) of sets of filters, each of the N sets of filters having a plurality (M) of filter elements; and
   at least one time encoding machine (TEM), each of the M filter elements of the N sets of filter elements being additively coupled to a corresponding input of the at least one TEM.

2. The encoder of claim 1 wherein the at least one TEM comprises an integrate-and-fire neuron.

3. The encoder of claim 1 wherein the at least one TEM comprises a neuron having multiplicative coupling.

4. The encoder of claim 1 wherein the at least one TEM comprises an asynchronous sigma/delta modulator.

5. The encoder of claim 1 further comprising a plurality (N) of adders, each adder coupled to a corresponding one of the N sets of filters and one of a plurality (N) of bias values.

6. The encoder of claim 1 wherein the at least one TEM comprises an irregular sampler.

7. The encoder of claim 1 wherein the at least one TEM generates a spike sequence.

8. The encoder of claim 1 wherein the at least one TEM comprises at least two ON-OFF neurons, each neuron being interconnected and having a feedback mechanism.

9. A decoder to decode a signal encoded by a multiple-input, multiple-output TEM encoder comprising:
   at least one Time Decoding Machine (TDM); and
   a filtering kernel comprising a plurality (N) of sets of filters, each of the N sets of filters having a plurality (M) of filter elements, a corresponding output of the at least one TDM being coupled to a corresponding one of the N sets of filters, each of the M filter elements of each set of filters being additively coupled to a corresponding M filter element of each other set of the N sets of filters.

10. The decoder of claim 9, wherein the filtering kernel has an overall response selected to at least substantially invert an encoding process of a TEM encoder used to encode the TEM-encoded signal.

11. The decoder of claim 9, wherein the TEM-encoded signal is irregularly sampled.

12. An encoder to encode a video stream signal comprising:
   a filter to receive the video stream signal, the filter having a plurality (N) of filter elements; and
   a Time Encoding Machine (TEM) to generate a plurality (N) of TEM encoded spatiotemporal field signals in response to a spatiotemporal field signal received from a corresponding one of the N filter elements.

13. The encoder of claim 12, wherein the spatiotemporal field signals are described by an equation:

$$v^j(t)=\int_{-\infty}^{+\infty}(\iint_X D^j(x,y,s)I(x,y,t-s)dxdy)ds,$$

where $D^j(x,y,s)$ is a filter function, and $I(x,y,t)$ represents the video stream signal.

14. The encoder of claim 12 wherein the N TEM-encoded spatiotemporal field signals are represented by a sampling function:

$\psi_k^j(x,y,t)=D(x,y,-t)*g(t-s_k^j)$, for k spike times, for each (x, y) in a bounded spatial set, where j corresponds to each of the N TEM-encoded spatiotemporal field signals, and where $g(t)=\sin(\Omega t)/\pi t$.

15. A decoder to decode a TEM-encoded video stream signal comprising:
   a Time Decoding Machine (TDM) to receive a plurality (N) of TEM-encoded spatiotemporal field signals, and for each TEM-encoded spatiotemporal field signal generate a TDM-decoded spatiotemporal field signal; and
   an adder to combine each of said TDM-decoded spatiotemporal field signals to recover the video stream signal.

16. A system to alter a video stream signal comprising:
   a plurality (N) of TEM-filters;
   a plurality (N) of reconstruction filters;
   a switching matrix, operatively coupled to the plurality (N) of TEM-filters and the plurality (N) of reconstruction filters, to map a plurality (N) of TEM-encoded spatiotemporal field signals received from the N TEM-filters to the plurality (N) of reconstruction filters in a video stream signal TDM.

17. The system of claim 16, adapted to rotate the video stream signal, wherein the switching matrix maps each of the N TEM-encoded spatiotemporal field signals from a corresponding TEM-filter ($[x,y]$, $\alpha$, $\theta$) to a corresponding reconstruction filter ($[x,y]$, $\alpha$, $\theta+l\theta_0$), where $l\theta_0$ represents a desired value of rotation.

18. The system of claim 16, adapted to zoom the video stream signal, wherein the switching matrix maps each of the N TEM-encoded spatiotemporal field signals from a corresponding TEM-filter ($[x,y]$, $\alpha$, $\theta$) to a corresponding reconstruction filter ($[x,y]$, $\alpha_0^m \alpha$, $\theta$), where $\alpha_0^m$ represents a desired value of zoom.

19. The system of claim 16, adapted to translate the video stream signal by a value $[nb_0, kb_0]$, wherein the switching matrix maps each of the N TEM-encoded spatiotemporal field signals from a corresponding TEM-filter ($[x,y]$, $\alpha$, $\theta$) to a corresponding reconstruction filter at ($[x+nb_0, y+kb_0]$, $\alpha$, $\theta$).

20. The system of claim 16, adapted to zoom the video stream signal by a value $\alpha_0^m$ and translate said video stream signal by a value $[nb_0, kb_0]$, wherein the switching matrix maps each of the N TEM-encoded spatiotemporal field signals from a corresponding TEM-filter ($[x,y]$, $\alpha$, $\theta$) to a corresponding reconstruction filter at ($[x+\alpha_0^m nb_0, y+\alpha_0^m kb_0]$, $\alpha_0^m \alpha$, $\theta$).

* * * * *